US006541750B1

(12) United States Patent
Smith

(10) Patent No.: US 6,541,750 B1
(45) Date of Patent: Apr. 1, 2003

(54) MODIFICATION OF A PROJECTION IMAGING SYSTEM WITH A NON-CIRCULAR APERTURE AND A METHOD THEREOF

(75) Inventor: Bruce W. Smith, Webster, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 09/527,640

(22) Filed: Mar. 17, 2000

Related U.S. Application Data
(60) Provisional application No. 60/124,831, filed on Mar. 17, 1999.

(51) Int. Cl.⁷ .............................................. H01L 27/00
(52) U.S. Cl. ..................... 250/208.1; 250/548; 250/216
(58) Field of Search .............................. 250/208.1, 548, 250/559.3, 559.27, 559.4, 216; 356/495, 498, 503; 355/53–55; 359/205–215, 738, 642, 649

(56) References Cited

U.S. PATENT DOCUMENTS

| | | | |
|---|---|---|---|
| 4,862,008 A | | 8/1989 | Oshida et al. ............... 250/548 |
| 5,534,970 A | | 7/1996 | Nakashima et al. .......... 355/53 |
| 5,625,471 A | * | 4/1997 | Smith ........................... 359/30 |
| 5,863,712 A | * | 1/1999 | Von Bunau et al. ........ 430/396 |

OTHER PUBLICATIONS

B. W. Smith and J. S. Petersen, "Influence of off–axis illumination on optical lens aberration," *J. Vac. Sci Technol. B,*16:6, 3405–3410 (1998), May 1998.
B. W. Smith, "Variations to the influence of lens aberration invoked with PSM and OAI," *Proc. SPIE Optical Microlithography XI,* 3679–3731 (1999), (Month Unknown).
B. W. Smith, L. Zavyalova, J. S. Petersen, "Illumination pupil filtering using modified quadrupole apertures," *Proc. SPIE Optical Microlithography XI,* 3334–3337 (1998), (Month Unknown).

\* cited by examiner

*Primary Examiner*—Que T. Le
(74) *Attorney, Agent, or Firm*—Nixon Peabody LLP

(57) ABSTRACT

A imaging tool for use with a mask with features oriented along at least an x-axis or a y-axis where the x-axis extends in directions substantially perpendicular to the directions of the y-axis. The tool has a condenser lens and an objective lens. The condenser lens has a condenser aperture with four-sides and four comers that are located in a condenser lens pupil plane. The sides of the condenser aperture are oriented in substantially the same direction as either the x-axis or the y-axis. The condenser lens is positioned to place at least a portion of any illumination on the mask and then into an objective lens pupil plane of the objective lens. At least one of the comers of the condenser aperture in the condenser plate may have a substantially rounded shape. Additionally, the mask may have at least one artifact added to at least one comer of the features for optical proximity correction.

26 Claims, 10 Drawing Sheets

RECTANGULAR APERTURE DIFFRACTION PATTERN

CIRCULAR APERTURE DIFFRACTION PATTERN

MODIFICATION OF A PROJECTION IMAGING SYSTEM WITH A NON-CIRCULAR APERTURE AND A METHOD THEREOF

This application claims the benefit of U.S. Provisional Patent Application Ser. No. 60/124,831 filed on Mar. 17, 1999 which is herein incorporated by reference.

FIELD OF THE INVENTION

This invention relates generally to projection imaging systems for optical lithography. More particularly, this invention is utilized in an optical lithographic exposure tool to improve the imaging performance through focus of features oriented along x and y axes or directions.

BACKGROUND OF THE INVENTION

Conventional projection imaging tools utilize circular apertures in both the objective lens and condenser lens systems allowing for equivalent imaging of features oriented in any direction. The objective lens has the ability to collect a finite amount of diffracted information from a mask, determined by its maximum acceptance angle or numerical aperture (NA). By limiting high frequency diffraction components, the lens acts as a low pass filter blocking information propagating at angles beyond its capability. Information that is passed is acted on by the lens to produce a second inverse Fourier transform operation, directing a limited reconstruction of the mask object toward the image plane. Depth of focus (DOF) is also a consideration when determining the capabilities of an optical imaging system. Depth of focus is defined as the distance along the optical axis $$DOF = +/- k_2 \lambda/NA^2,$$

that produces an image of some suitable quality. The Rayleigh depth of focus generally takes the form: where $k_2$ is a process dependent factor. For a resist material of reasonably high contrast, $k_2$ may be on the order of 0.5. DOF decreases linearly with wavelength and as the square of numerical aperture. Depth of focus is closely related to defocus, the distance along the optical axis from a best focus position. The acceptable level of defocus for a lens system will determine the usable DOF. Tolerable levels of this aberration will ultimately be determined by the entire imaging system as well as the feature sizes of interest.

For the situation described, coherent illumination allows for simplification of optical behavior. Diffraction at a mask is effectively a Fourier transform operation. Part of this diffracted field is collected by the objective lens, where diffraction is in a sense "reversed" through a second Fourier transform operation.

Partial coherence can be thought of as taking an incoherent sum of coherent images. For every point within a source of finite extent, a coherent Fraunhofer diffraction pattern is produced. For a point source on axis, diffracted information is distributed symmetrically and discretely about the axis. For off axis points, diffraction patterns are shifted off axis and, as all points are considered together, the resulting diffraction pattern becomes a summation of each individual distribution. The zeroth order is centered on axis, but with a width >0, a result of the extent of partially coherent illumination angles. Similarly, each higher diffraction order also has width >0, an effective spreading of discrete orders.

The impact of partial coherence is realized when the influence of an objective lens is considered. By spreading the diffraction orders around their discrete coherent frequencies, operation on the diffracted information by the lens produces a frequency averaging effect of the image and loss of image modulation. This image degradation is not desirable when coherent illumination would allow for superior image reconstruction. If, however, a situation exists where coherent illumination of a given mask pattern does not allow for lens collection of diffraction orders beyond the zeroth order, partially coherent illumination would be preferred.

Consider a coherently illuminated rectangular grating mask where +/−first diffraction orders fall just outside a projection systems lens NA. With coherent illumination, imaging is not possible as feature sizes fall below the $R=0.5\lambda/NA$ limit. Through use of partial coherent illumination, partial first diffraction order information can be captured by the lens, resulting in imaging capability. Partial coherent illumination, therefor, is desirable as mask features fall below $R=0.5\lambda/NA$ in size. An optimum degree of coherence can be determined for a feature based on its size, the illumination wavelength, and the objective lens NA.

Referring to FIG. 1, a graph of image log slope vs. partial coherence plot for features of size $R=0.4\lambda/NA$ to $0.6\lambda/NA$ shows how partial coherence impacts imaging through measurement of the aerial image log-slope or ILS. This metric measures the slope of the log of the intensity image produced by the imaging system where larger values correspond to an increase in image fidelity. Changes in this log aerial image gradient directly influence resist profile and process latitude. As this graph illustrates, for increasing levels of partial coherence, image log slope increases for features smaller than $0.5/NA$ and decreases for features larger than $0.5\lambda/NA$.

For evaluation of DOF using partial coherence, the distribution of diffraction orders needs to be considered. For coherent illumination, there is a discrete difference in optical path length traveled between diffraction orders. By using partial coherence, however there is an averaging effect of the optical path over the lens pupil. By distributing frequency information over a broad portion of the lens pupil, the differences in path lengths experienced between diffraction orders is reduced. In the limit for complete incoherence, the zero and first diffraction orders essentially share a similar pupil area, significantly reducing the effects of defocus. This can be seen in FIG. 2, which is similar to FIG. 1 except a large defocus value has been incorporated. This graph in FIG. 2 shows that at low partial coherence values, ILS is reduced. At high partial coherence levels, however, ILS remains high indicating a greater DOF is possible.

SUMMARY OF THE INVENTION

An imaging tool for use with a mask with features oriented along at least an x-axis or a y-axis where the x-axis extends in directions substantially perpendicular to the directions of the y-axis in accordance with one embodiment of the present invention includes a condenser lens. The condenser lens has a condenser aperture with four-sides and four corners located in a condenser lens pupil plane. The sides of the condenser aperture are oriented in substantially the same direction as either the x-axis or the y-axis and at least one of the corners has a substantially rounded shape.

A projection imaging system in accordance with another embodiment of the present invention includes a mask, a condenser lens and an illuminator. The mask has features oriented along at least an x-axis or a y-axis. At least one artifact is added to at least one corner of the features for optical proximity correction. The condenser lens has a condenser aperture with four-sides and located in a condenser lens pupil plane. The sides of the condenser aperture are oriented in substantially the same direction as either the x-axis or the y-axis. The illuminator is positioned to illuminate at least a portion of the condenser lens pupil plane through the condenser aperture. The condenser lens is positioned to place at least a portion of the illumination on to at least a portion of the features of the mask.

A method for lithography in accordance with another embodiment of the present invention includes a few steps. First, at least a portion of a condenser lens pupil plane of a condenser lens is illuminated. Next, the illumination from the condenser lens is directed on to at least a portion of a mask. The mask has features oriented along at least an x-axis or y-axis. The x-axis extends in directions substantially perpendicular to the directions of the y-axis and the condenser lens has a condenser aperture located in the condenser lens pupil plane. The condenser aperture has four-sides and four corners. Each of the sides of the condenser aperture are oriented in substantially the same direction as either the x-axis or the y-axis and at least one of the corners has a substantially rounded shape.

A method for lithography in accordance with another embodiment of the present invention includes a few steps. First, at least a portion of a condenser lens pupil plane of a condenser lens is illuminated. Next, the illumination from the condenser lens is directed on to at least a portion of a mask. The mask has features oriented along at least an x-axis or y-axis and at least one artifact is added to at least one corner of the features for optical proximity correction. The x-axis extends in directions substantially perpendicular to the directions of the y-axis. The condenser lens has a condenser aperture located in the condenser lens pupil plane. The condenser aperture has four-sides with each of the sides of the condenser aperture oriented in substantially the same direction as either the x-axis or the y-axis.

The present invention provides a number of advantages including improving imaging for lithography, particularly for integrated circuit designs whose feature are primarily oriented in either an X-axis and/or Y-axis directions. The use of square shaped illumination takes advantage of IC geometry oriented on X/Y directions. The combination of square shaped illumination for the condenser and/or objective lens apertures along with optical proximity correction and/or rounding one or more corners of the condenser aperture further improves imaging for some applications.

DETAILED DESCRIPTION

Figure 1:
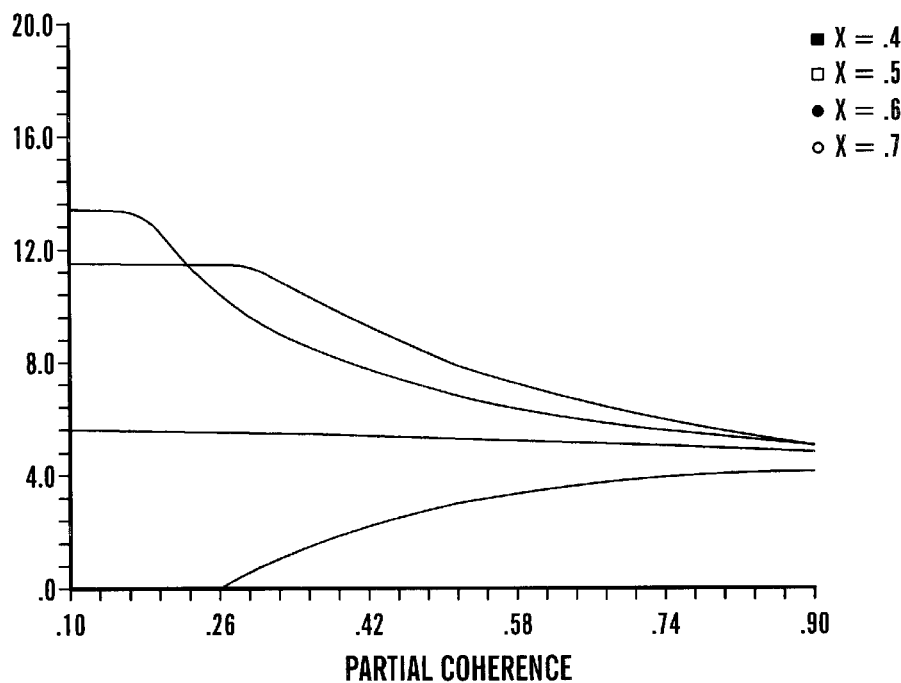
FIG. 1 is a graph of an image log slope versus partial coherence for dense features from 0.4 λ/NA to 0.6 λ/NA.
Figure 2:
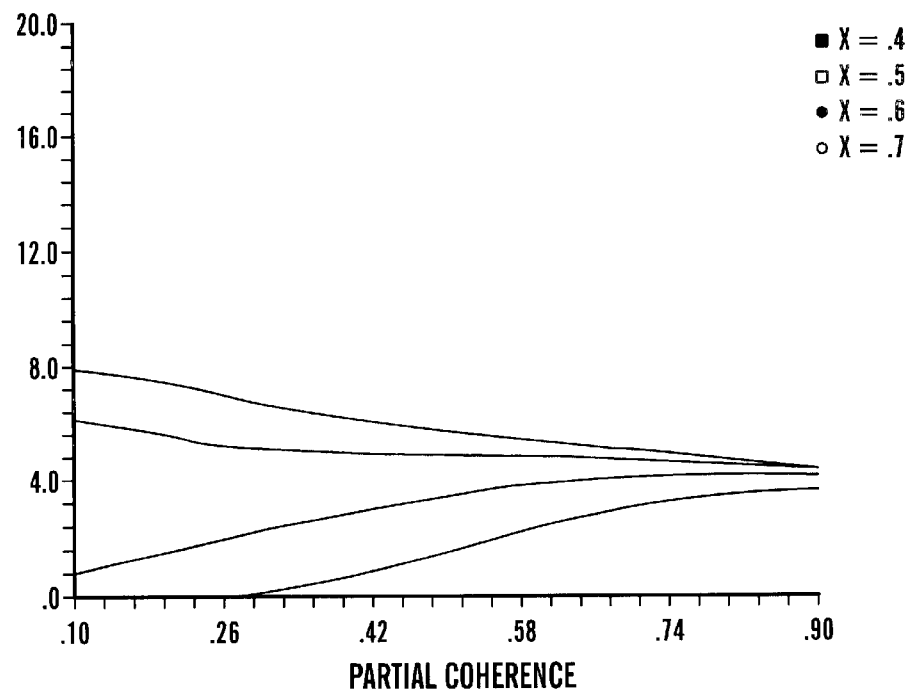
FIG. 2 is a graph of image log slope versus partial coherence for dense features from 0.4 λ/NA to 0.6 λ/NA with 0.5 λ/NA$^2$ of defocus.
Figure 3A:
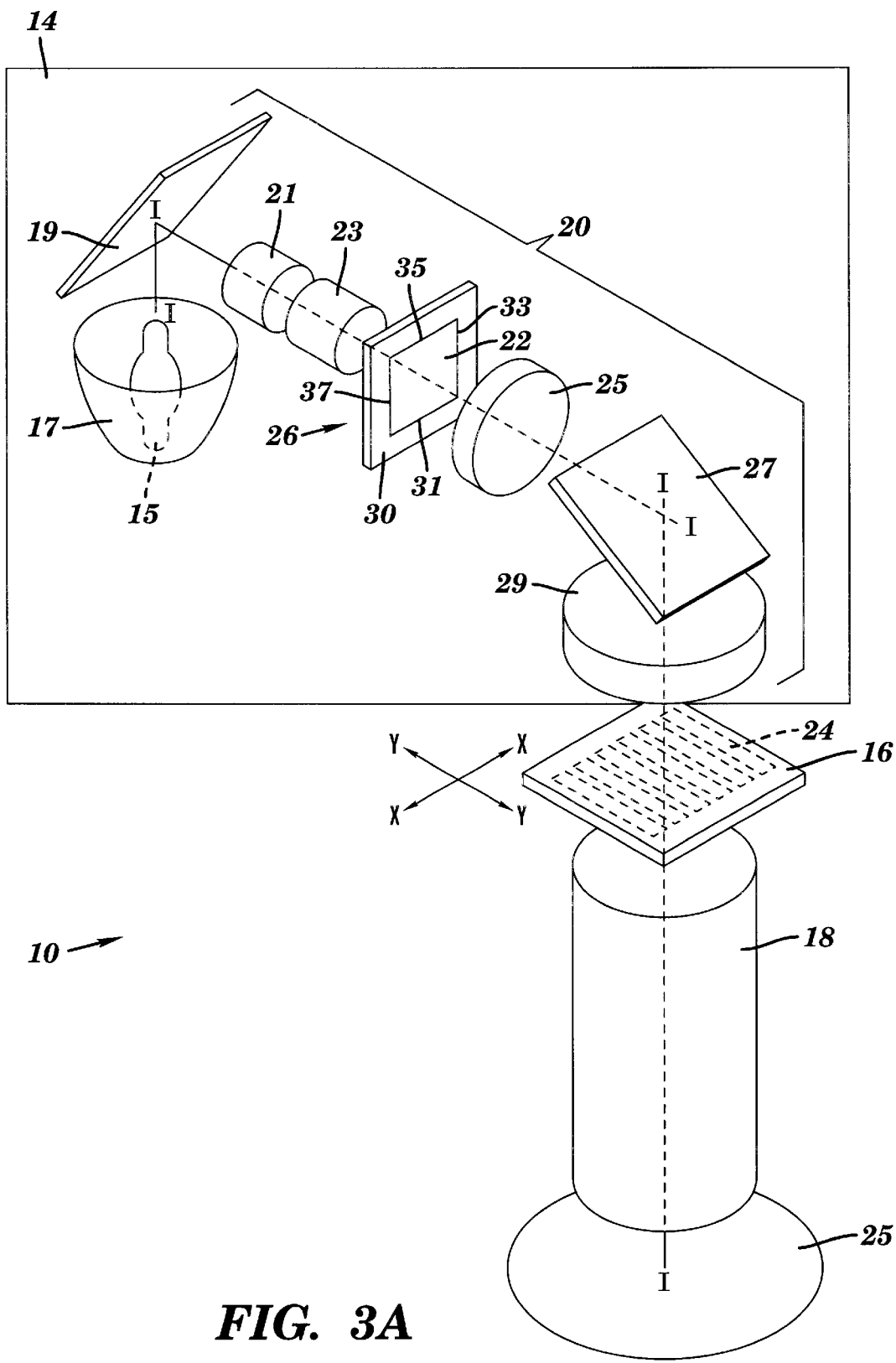
FIG. 3A is a block diagram of a projection imaging system in accordance with one embodiment of the present invention.
Figure 3D:
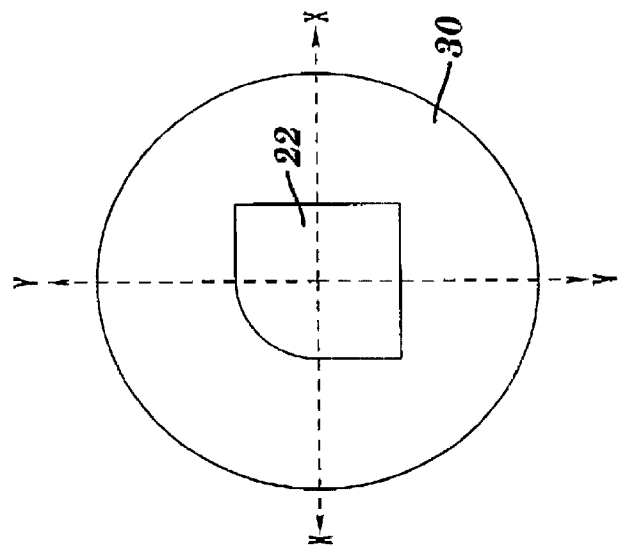
FIG. 3D is a front view of a condenser plate with a square shaped aperture with a rounded corner.

A projection imaging system or tool 10 in accordance with one embodiment of the present invention is illustrated in FIG. 3A. The projection imaging system 10 includes an illumination system 14, a mask 16, an objective lens 18, and a condenser lens 20 having an aperture plate 30 with an aperture 22 with four-sides where sides 31 and 35 are oriented in substantially the same direction as or substantially parallel to an x-axis (which is identified as X—X in FIG. 3A) and sides 33 and 37 are oriented in substantially the same direction as or substantially parallel to a y-axis (which is identified as Y—Y in FIG. 3A). The projection imaging system 10 provides a number of advantages including performance improvements over circular apertures in terms of resolution and focal depth.

Figure 3C:
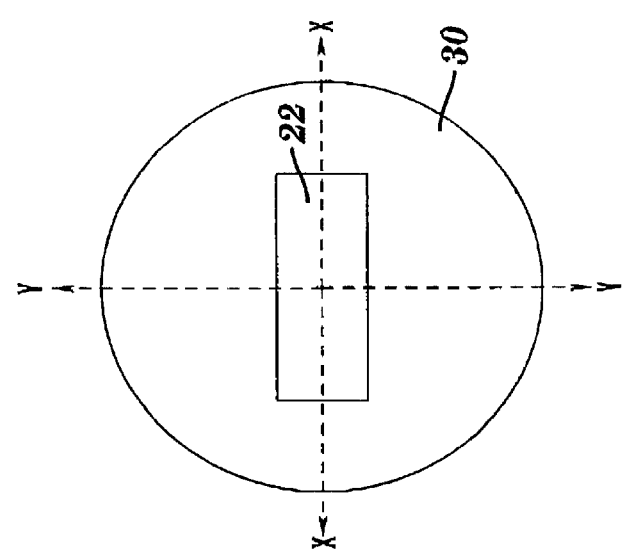
FIG. 3C is a front view of a condenser plate with a rectangular shaped aperture.
Figure 3B:
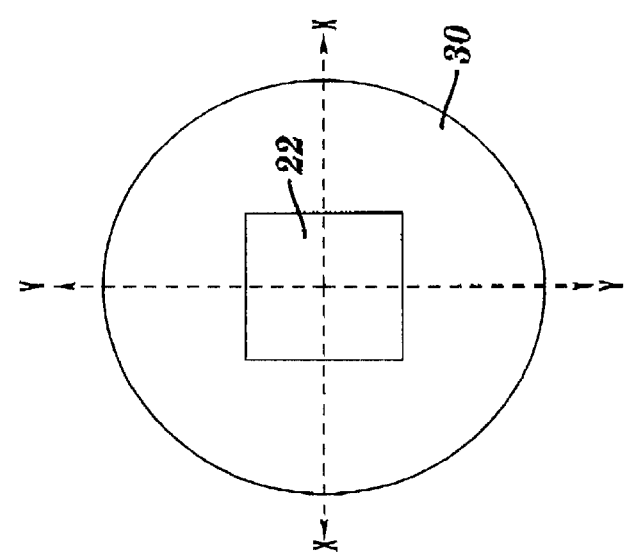
FIG. 3B is a front view of a condenser plate with a square shaped aperture.

Referring to FIGS. 3A–3C, the illumination system 14 is positioned to direct illumination on to the mask 16 and then into an objective lens 18 and onto a substrate 25. In this particular embodiment, the illumination system includes a light source 15, a reflector 17, and a condenser lens 20 as described in greater detail below. The light source 15 and reflector 17 direct illumination towards the objective lens 18. Additionally in this particular embodiment, the condenser lens system 20 is part of the illumination system 14, although the condenser lens system 20 could be constructed to be separate from the illumination system 14, if needed or desired.

In this particular embodiment, the condenser lens 20 is a condenser lens system 20 including a mirror 19 which directs the illumination from light source 15 along the axis I—I and then redirects the illumination along the axis I—I through a pair of lens 21 and 23, through an aperture 22 in an aperture plate 30 located in a condenser lens pupil plane 26, through another lens 25, off of a mirror 27 and through a lens 29 along the redirected axis I—I onto at least a portion of the mask 16, although the condenser lens system 20 could be made of other types and combination of one or more components in other configurations, such as a single lens, as needed or desired.

In this particular embodiment, the aperture plate 30 has the aperture 22 which has four-sides that form the shape of a rectangle, although the sides 31, 33, 35, and 37 could be connected together to form other shapes, such as a square shape. The sides 31 and 35 of the aperture 22 are oriented in substantially the same direction as or substantially parallel to an x-axis and the sides 33 and 37 are oriented in substantially the same direction as or substantially parallel to a y-axis.

The aperture plate 30 is positioned to be in alignment with the condenser lens pupil plane 26. A variety of different types of materials can be used to form the aperture plate 30. By way of example only, the plate 30 may be a metal or glass (fused silica) sheet with the aperture 22. The aperture 22 may be left open or may be filled with a translucent material. The user of the projection imaging system 10 can change the aperture plate 30 to adjust for different aperture sizes and shapes needed for specific feature types and/or sizes in different applications. By way of example only, an aperture plate 30 with a square shaped aperture 22 is shown in FIG. 3B and an aperture plate 30 with a rectangular shaped aperture 22 is shown in FIG. 3C. Although in these particular examples, the plates 30 have a circular outer shapes or envelopes, the plates 30 and 32 can have other outer shapes as long as they can be placed in the condenser lens pupil plane 26. Additionally, although in this particular embodiment the aperture 22 is formed in the aperture plate 30 which is located in the condenser lens pupil plane 26, other devices and/or techniques for forming the aperture 22 in the pupil plane 26 of the condenser lens system 22 can also be used, such as forming the aperture 22 in a pupil plane of a lens which comprises the condenser lens 20.

The condenser lens system 20 directs at least a portion of the illumination along the axis I—I, in this particular example, onto at least a portion of the mask 16. Since masks 16 which are used in lithographic applications are well known to those of ordinary skill in the art, they will not be discussed in detail here. In this particular embodiment, the mask 16 includes features 24 which are aligned along either an x-axis or direction (which again is identified as X—X in FIG. 3A) or a y-axis or direction (which again is identified as Y—Y in FIG. 3A). The x-axis extends in direction which is about ninety degrees offset from or substantially perpendicular to a direction for the y-axis. Illumination from the illumination system 14 passes through the condenser lens system 20 and onto at least a portion of the features 24 of the mask 16.

The objective lens 18 is positioned after the mask 16 and directs the illumination passing through the features 24 in mask 16 onto the substrate 25. In this particular embodiment, the objective lens 18 comprises a single lens, although the objective lens can be made of multiple components arranged in differing configurations as needed or desired. With respect to the objective lens 18, minimum and balanced aberration performance is desired over the full objective lens 18 and maximum radial symmetry is targeted.

With respect to the condenser lens system 20, the aperture 22 in the aperture plate 30 is chosen for optimal illumination of mask geometry and distribution of diffraction information. The choice of partial coherence will depend on the projection imaging system 10 (its wavelength and numerical aperture), the feature size, and the requirement for DOF. In a two-dimensional situation, the degree of partial coherence is configured as $NA_C/NA_O$ where $NA_C$ is the condenser lens numerical aperture, $NA_O$ is the objective lens numerical aperture, and the ratio is known as the partial coherence factor, (. Partial coherence is generally limited to a values of 0.8 or below, though values to 1.0 are possible. What the present invention has recognized is that there is flexibility in the choice of the shape of the aperture 22 as well as size if the ultimate goal is to maximize the efficiency of diffraction order collection. Since integrated circuit (IC) device geometry is often constrained to X/Y orientations, there may be a similar preferred X/Y character to the illumination system 10 via the aperture 22 in the condenser lens pupil plane 26.

For integrated circuit (IC) microlithography, feature orientation is generally limited to x-axis X—X or direction and y-axis Y—Y or direction (or 0 and 90°) with limited geometry at other angles. What the present invention recognizes is that apertures for this feature orientation would be optimized, if designed to take full advantage of this limited distribution of geometry. More specifically, when designing the pupil distribution for a condenser lens system 20 (or correspondingly $NA_C$), a source shape for the aperture 22 should be chosen which places the highest degree of first order frequency information within the objective lens 18 as possible with the least amount of frequency averaging.

The frequency and spatial representations of square and circular pupils are often assumed to be equivalent. This is a convenient method of understanding the behavior of an optical imaging system 10, where a one-dimensional representation of a circular pupil is evaluated as a square function. Since only a circular pupil is radially symmetric, these functions, as well as their Fourier Transforms, are not equivalent. The two-dimensional fourier transform of a circularly symmetric function may be better evaluated by using the Hankel transform, which can be expressed as $$H(p;v)=2\pi \int h(r) J_v(2\pi pr) r dr$$

where $J$, is the nth order Bessel function, and r and p are radial coordinates in space and frequency domains. Properties of this transform are similar to the Fourier Transform. It is unique though in that it is also self-reciprocal. The Hankel transform of a circular pupil gives rise to what is commonly referred to as Besinc function, which when squared is also known as the Airy function:

$$\text{Airy function} = \left| \text{Besinc}(u) = \frac{2J_1(u)}{u} \right|^2$$

Figure 4A:
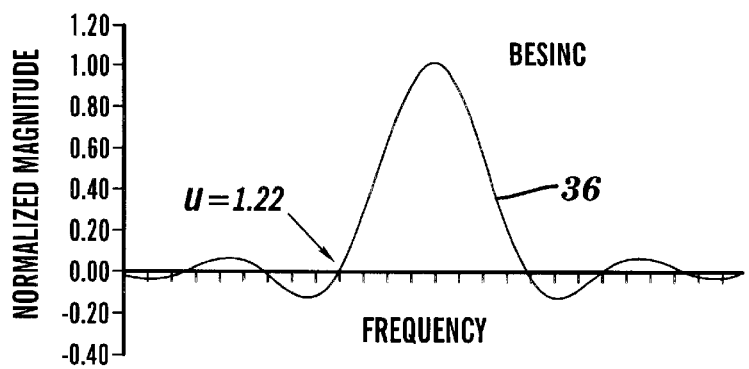
FIG. 4A is a graph illustrating a transform function of a circular shaped pupil.
Figure 4B:
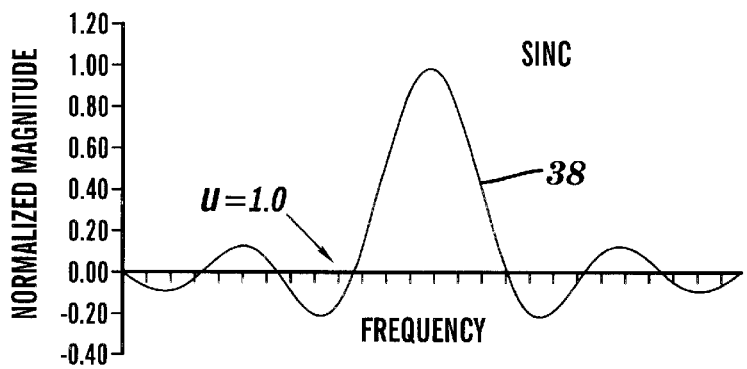
FIG. 4B is a graph illustrating a transform function of a square shaped pupil.

Circular and square pupil functions are not equivalent. Köhler illumination images a condenser lens pupil into the frequency plane of an objective lens 18. Circular and square shaped functions act to spread the frequency of diffraction orders in this plane. Their Fourier (or Hankel) transforms are shown in FIGS. 4A and 4B, respectively. The Optical Transfer Function (OTF) is a convolution of condenser lens and objective lens pupils. This translates in the image plane to the product of the Fourier Transform of the two pupils. When squared, this becomes the Point Spread Function (PSF), which is an indication of the "blur" a point image experiences in an otherwise perfect system. A system 10 that utilizes circular pupils has a PSF character with a Sinc$^2$ character while the PSF for a system with a circular objective pupil and a square illuminator pupil is proportional to the product of Besinc and Sinc functions 36 and 38. The potential improvement of using a square pupil is suggested here.

Referring to FIGS. 4A and 4B, more of the total area of a Besinc function 36 is contained in the region bounded by the first minima compared to that for a Sinc function 38. The impact on the PSF is an increased confinement, leading to potential improvements in imaging. Evaluation of the OTF for circular and for square pupils also indicates improvement.

Figure 5:
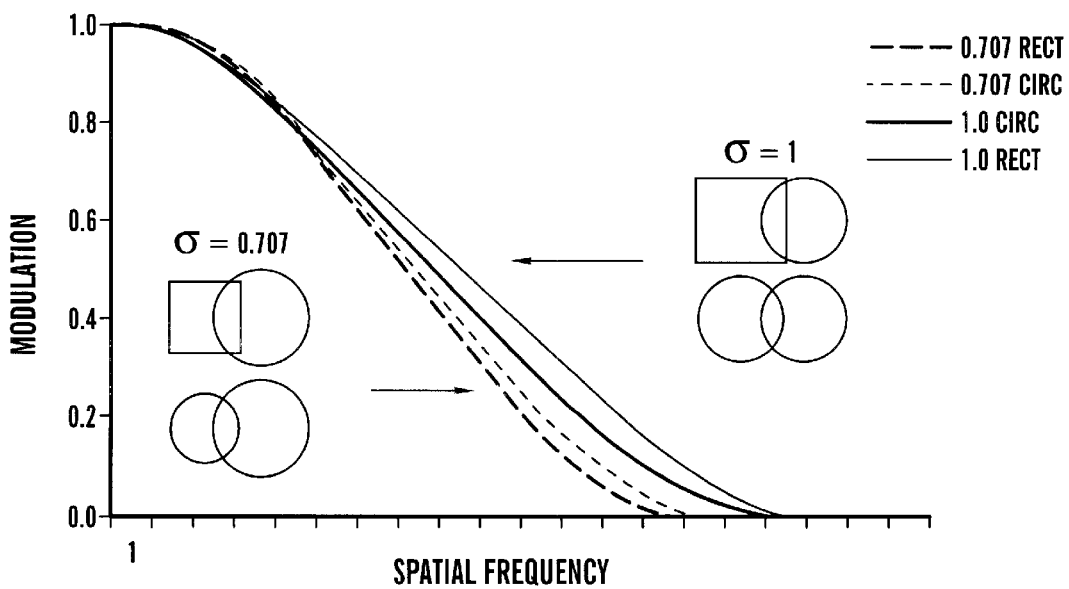
FIG. 5 is a graph illustrating an optical transfer function for square and circular pupils illuminating a circular objective lens pupil.

FIG. 5 shows modulation versus spatial frequency comparisons for square and circular illumination pupils combined with circular objective lens pupils. In one case, a circular illumination pupil with a corresponding σ value of 0.707 [or 1/sqrt.(2)] is compared to a square pupil measured with the same v value half-width. This corresponds to the largest square shape that can fit into an illuminator pupil with maximum a value of 1.0. The performance of the square pupil dominates at all frequencies. A comparison is also made for full σ=I pupils. The performance of this circular pupil also appears inferior to the square pupil.

Figure 6A:
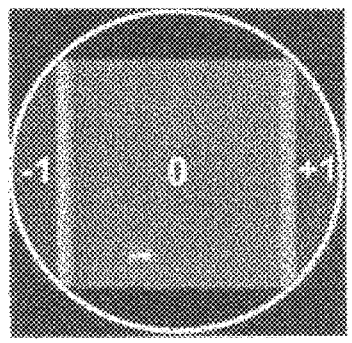
FIG. 6A is a diagram illustrating frequency distribution of diffraction orders in an objective lens for square shaped illumination.
Figure 6B:
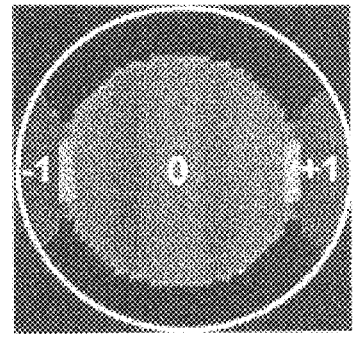
FIG. 6B is a diagram illustrating frequency distribution of diffraction orders in an objective lens for circular shaped illumination.

FIGS. 6A and 6B demonstrate the situation from a spatial frequency perspective. In this particular example, the objective lens pupil 28 is filled by diffraction orders from a mask 16 with features 24 corresponding to a $k_1$ factor near 0.35. Circular and square shapes are compared in these figures. For both situations, the objective lens 18 collects all of the zero diffraction order and part of the first orders. The spread of the first orders is determined by the illuminator pupil size and shape. Although the collection of the first diffraction order on the spatial frequency axis is equivalent in both cases, the total "area" of the first order collected for the square pupil case shown in FIG. 6A is larger than for the circular shape shown in FIG. 6B for X/Y oriented features. This improvement is lithographically significant.

Figure 7:
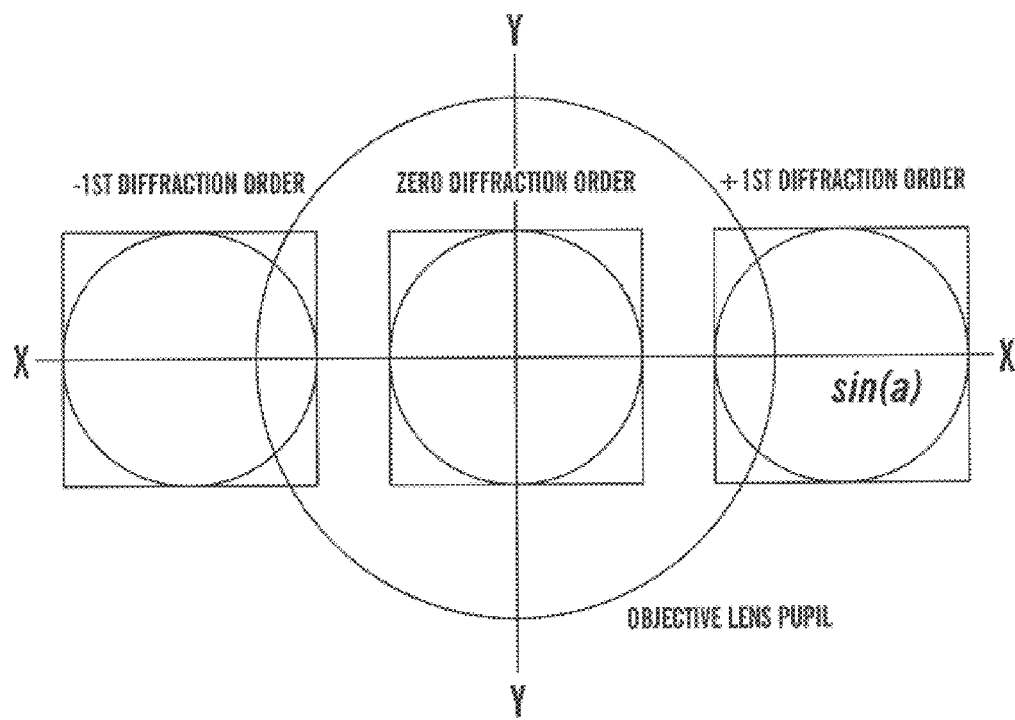
FIG. 7 is a diagram illustrating a comparison of square aperture illumination of dense x-oriented features to circular illumination features.

Referring to FIG. 7, a diagram is illustrated which compares the information captured in the objective lens pupil 28 for a circular shaped aperture 22 and a square shaped aperture 22 of the same width. In the case of the square shaped aperture 22, less frequency averaging (or spreading) is required to place first order frequency information in the objective lens pupil 28 than for a circular shaped aperture 22. To match the square aperture situation with a circular aperture, a higher degree of partial coherence would be needed, resulting in an increase in degradation as diffraction orders are spread.

Figure 8:
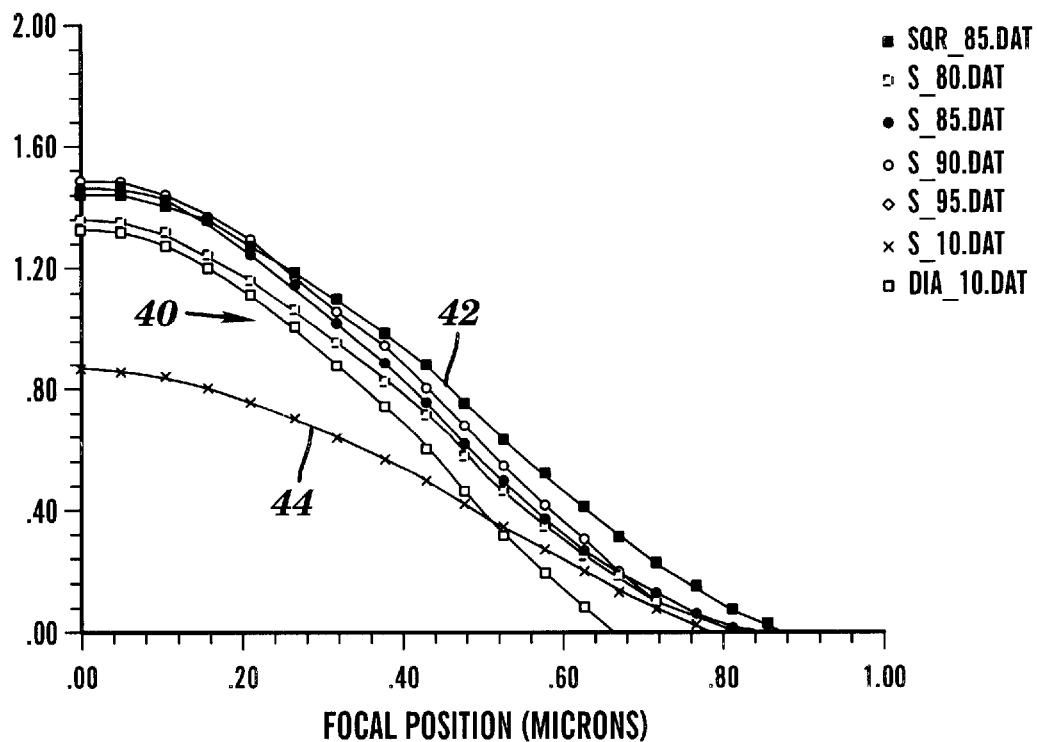
FIG. 8 is a graph illustrating a comparison of imaging performance or normalized image log-slope (NILS) for circular apertures with a partial coherence equal to 0.80, 0.85, 0.90, 0.95, and 1.0 to a square aperture with a partial coherence equal to 0.85, and a diamond aperture with a partial coherence equal to 1.0.

Referring to FIG. 8, this graph shows how no condition of partial coherence using a circular shaped aperture 22 can match the performance of a square shaped aperture 22. In this graph, dense, equal 0.12 μm lines 40 imaged using circular apertures with a values corresponding to 0.80, 0.85, 0.90, 0.95, and 1.0 and a line 42 imaged using an optimized square aperture 22 with an effective σ of 0.85 are shown. Normalized image log slope (NILS=CDxILS) is plotted as a function of focal position. A similar analysis for a line 44 imaged using diamond shaped aperture 22 which leads to decreased performance over a circular shaped aperture 22, is also shown.

To further evaluate the performance potential of square shaped illumination, aerial image simulation has been performed using a high NA scalar model. In this particular example, a three bar elbow pattern 46 shown in FIG. 9 was evaluated. In this example, the imaging situation studied utilized a 248 nm wavelength, a 0.60 NA objective lens, and 160 nm line features using various illumination conditions. Comparisons of circular and square illumination shapes were made through measurement of aerial images, using aerial image intensity and normalized image log slope (NILS). Image orientations along X/Y and 45 degree directions were included.

Figure 10A:
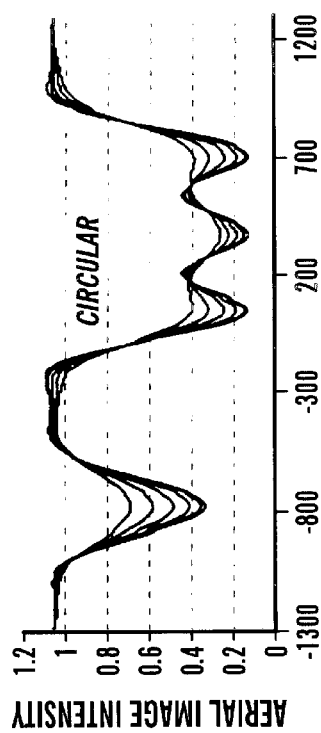
FIG. 10A is a graph of aerial image intensity versus horizontal position for a circular source shape for a horizontal cut line through the elbow pattern shown in FIG. 9.
Figure 10B:
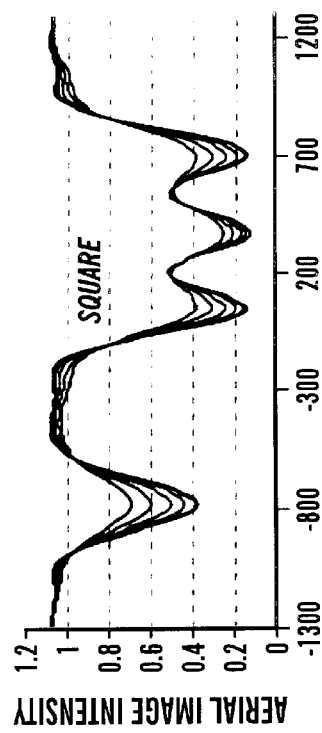
FIG. 10B is a graph of aerial image intensity versus horizontal position for a square source shape for a horizontal cut line through the elbow pattern shown in FIG. 9.

Referring to FIGS. 10A and 10B, a comparison of aerial images along horizontal cut line 48 of the mask 46 for circular and square illuminator shapes with σ values of 0.70 is shown. Images were generated through 0.5 micron of defocus. As illustrated in these graphs, the use of the square shaped illumination pupil formed by the square shaped aperture 22 leads not only to improved performance for features at best focus, but also as defocus is considered. The impact is greatest for central grouped features, as would be expected by considering the distribution of the diffraction field.

Figure 9:
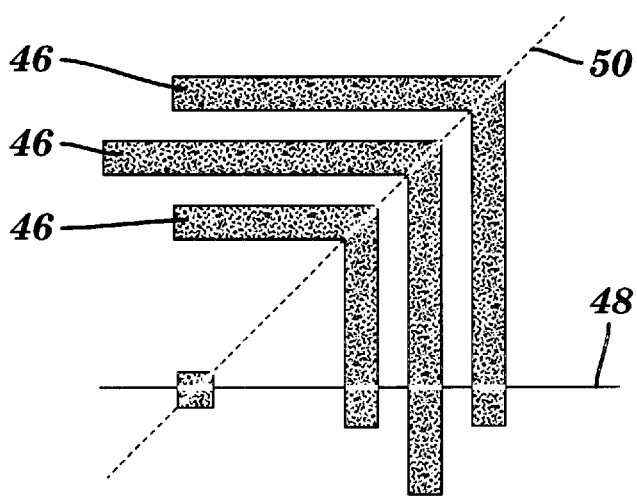
FIG. 9 is a diagram of a two dimensional mask.
Figure 11A:
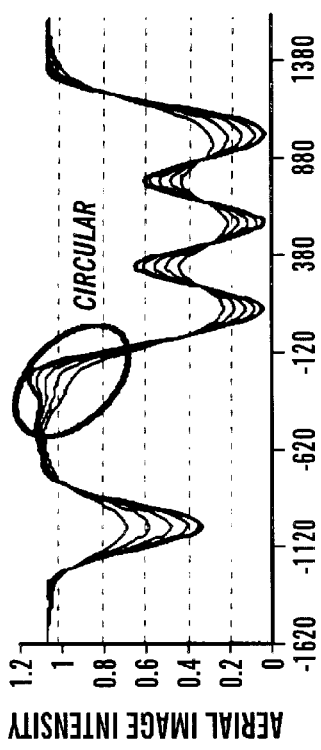
FIG. 11A is a graph of aerial image intensity versus horizontal position for a circular source shape for a horizontal cut line through the elbow pattern shown in FIG. 9.
Figure 11B:
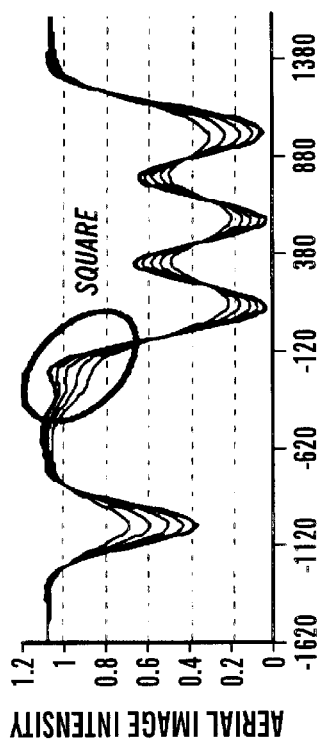
FIG. 11B is a graph of aerial image intensity versus horizontal position for a square source shape for a horizontal cut line through the elbow pattern shown in FIG. 9.

A concern about diagonal orientations follows naturally, and is evaluated as shown in the graphs in FIGS. 11A and 10B. In this particular embodiment, a cut line 50 along a 45 degree angle, as depicted in FIG. 9, is analyzed. Results show improvement for features at this orientation as well, though for different reasons than those for the X/Y orientation. In this case, the size of features 46 is larger by a factor of sqrt. (2) as is the effective partial coherence value for the square pupil. This decrease in coherence can accommodate higher frequency, leading to increased performance.

As the above examples illustrate, the use of aperture 22 in accordance with the present invention, such as a square shaped aperture or a rectangular shaped aperture, take advantage of IC geometry oriented on X/Y directions. Square illumination approaches have been shown to offer significant improvement over circular apertures at relatively low cost.

Figure 12:
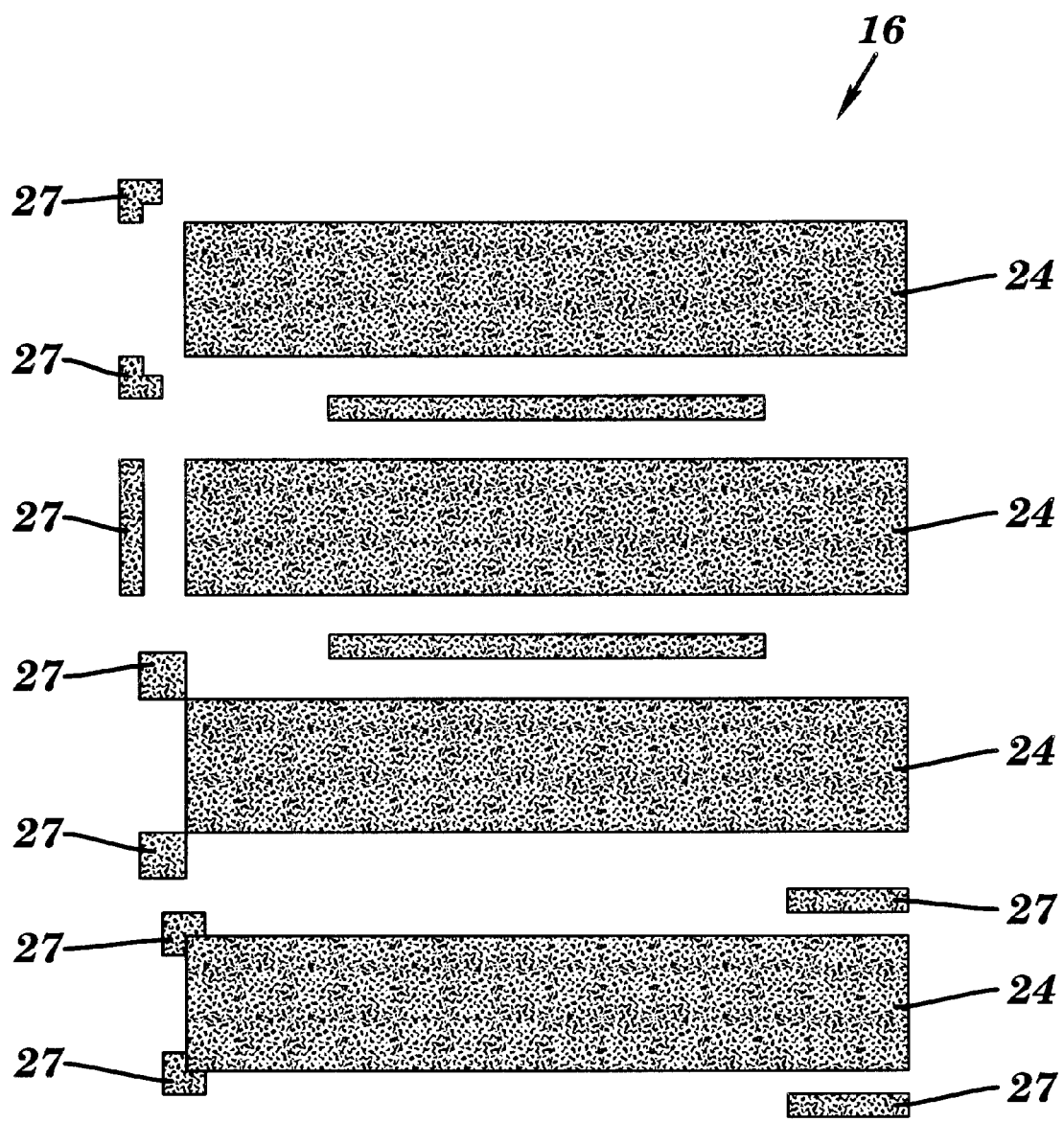
FIG. 12 is a top view of one example of a mask with features with artifacts in corners of the features.
Figure 13:
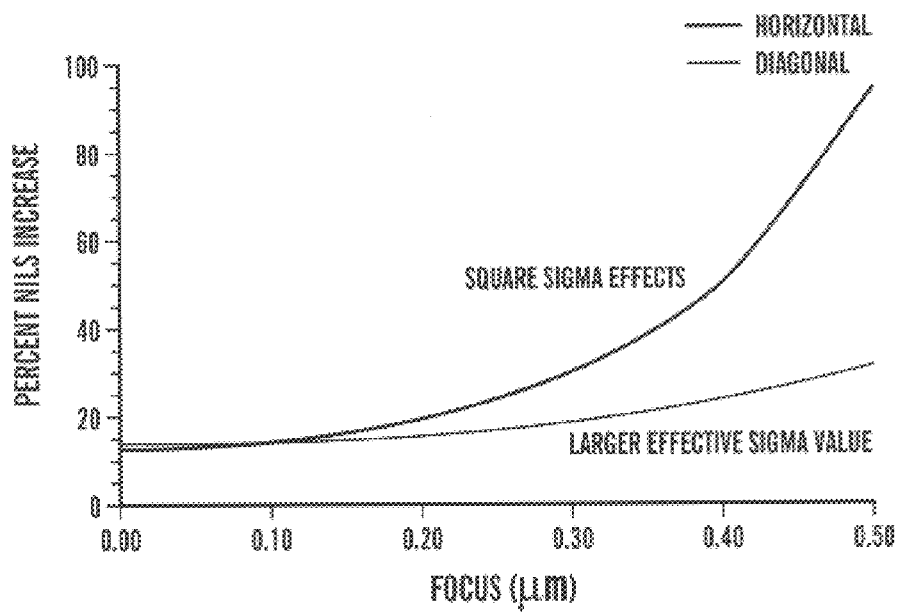
FIG. 13 is a graph illustrating the improvement of a square shaped aperture over a circular aperture for horizontal and diagonal orientations of features.
Figure 14A:
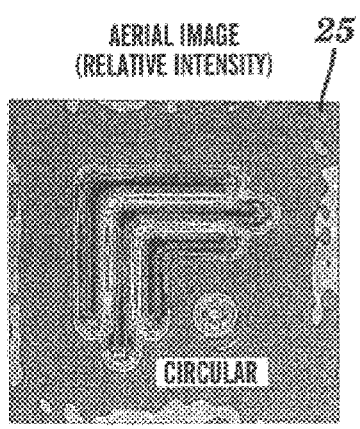
FIG. 14A is a top view of an example of a substrate imaged with a circular aperture in the condenser lens and with artifacts in the mask.
Figure 14B:
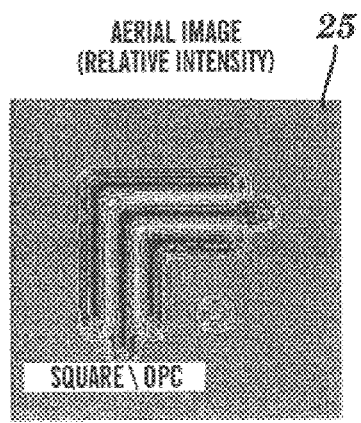
FIG. 14B is a top view of an example of substrate imaged with a square aperture in the condenser lens and with artifacts in the mask.

Features oriented at 45 degrees (rather than X and Y) are adversely impacted by a square illuminator pupil as shown in FIG. 13. In order to compensate for this effect, which can lead to things, such as corner rounding, additional feature artifacts can be added to feature corners. Adding artifacts is referred to as optical proximity correction (OPC) and is used to improve fine features in corner details. What the present invention has recognized is that the use of square shaped apertures with OPC, at corners for fine features, improves imaging. By using these mask artifacts or by biasing the corners or non-X/Y geometry, performance can be improved while realizing the advantages of the square pupil shape for X/Y geometry. By way of example only, a mask 16 with of such features 24 and artifacts 27 or biasing is shown in FIG. 12. Imaging of a mask 16 with a square shaped pupil and OPC is superior to a round shaped pupil, as shown in FIGS. 14A and 14B. X/Y feature performance is improved via illumination with a square shaped aperture 22 and corner performance is improved via illumination with a square shaped aperture 22 and OPC as described above.

Figure 15A:
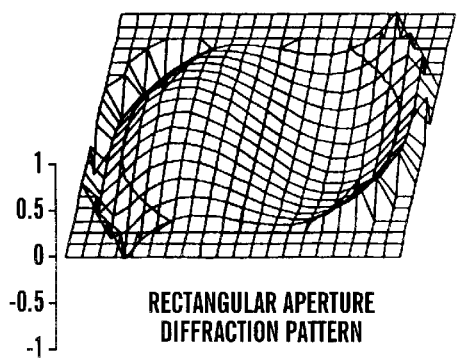
FIG. 15A is a diagram illustrating the impact of illumination on coma aberration effects with a rectangular diffraction pattern.
Figure 15B:
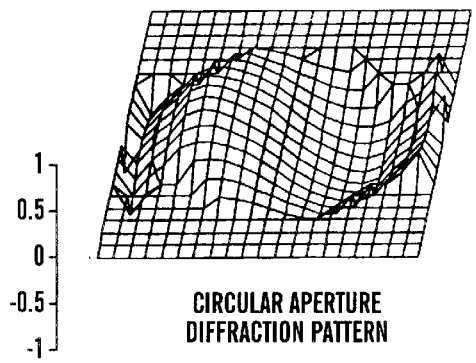
FIG. 15B is a diagram illustrating the impact of illumination on coma aberration effects with a circular diffraction pattern.

The influence of aberrations on imaging is becoming an increasingly greater concern as optical imaging is pushed and various resolution enhancement methods are considered. Coma effects are especially critical as image shifting and degradation in modulation can occur. Referring to FIGS. 15A and 15B, diagrams comparing the situation of imaging with coma for square illumination and circular illumination pupils formed by the aperture 22 in the condenser lens system 20. The diffraction field in the objective lens 18 is plotted with the presence of 0.25 waves of primary coma. Feature size corresponds to a $k_1$ of 0.38 and σ is 0.7, placing first diffraction orders toward the edge of the pupil. Comparison of these diffraction fields shows how square illumination from the square shaped aperture 22 distributes first diffraction order information over more of the objective lens pupil than the circular illumination does. This can lead to an increase in an averaging effect over the lens pupil, which can be beneficial if the result is a lowering of OPD or phase error.

Figure 16:
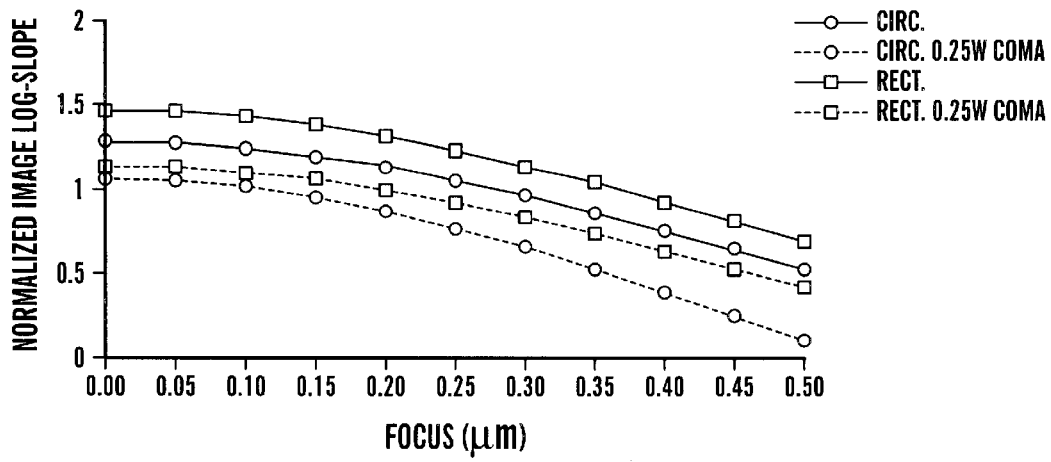
FIG. 16 is a graph illustrating normalized image log slope versus focus for circular and rectangular source shapes.

Referring to FIG. 16, the impact on aerial images for circular and square source shapes for the aperture 22 are shown. NILS vs. focus is plotted for circular and square illumination using an ideal (perfect) objective lens 18 and an objective lens 18 with 0.25 waves of primary coma. Although this level of coma is exaggerated over what would be expected in a lithographic lens, it allows for consideration of the potential impact. In the presence of coma, square illumination from a square shaped aperture 22 shows improvement over circular illumination from a circular shaped aperture 22. As defocus is considered, the performance with the square shaped aperture 22 further dominates. At 0.5 μm of defocus, the square illumination performance with coma aberration approaches that for the circular illumination and perfect lens. Image improvement effects for other aberration types, including spherical and astigmatism, are similar.

Figure 17:
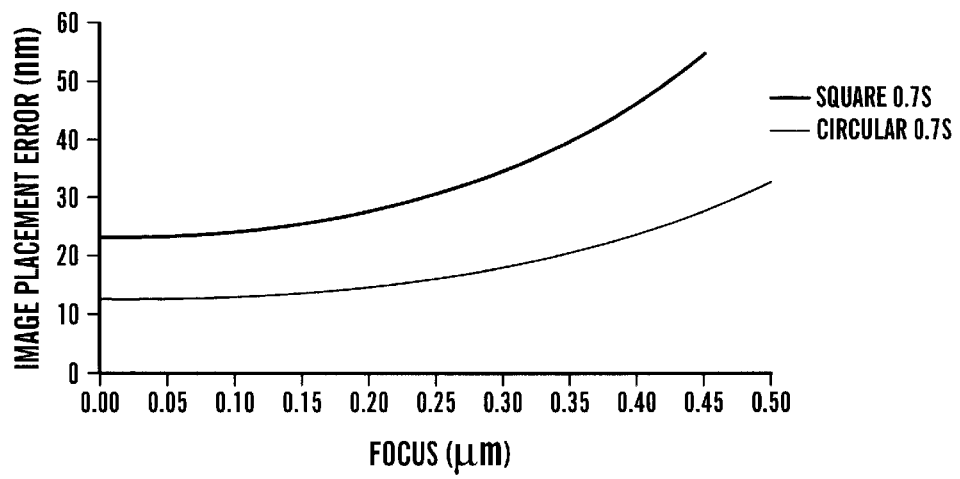
FIG. 17 is a graph illustrating image placement error versus focus for circular and square source shapes.

Referring to FIG. 17, the effects of coma on induced image placement error (IPE) for circular and square source shapes for aperture 22 influenced by illumination are shown. In this particular example, 0.25 waves of coma is also considered. IPE vs. defocus for square illumination is lower at best focus. As defocus is introduced, the increase in IPE remains significantly lower for square illumination. Results from tilt and higher order coma are similar.

To extend the limits of optical lithography, imaging enhancement approaches need to be considered. Flexibility increases as some constraints are allowed. The use of square shaped optical systems takes advantage of IC geometry oriented on X/Y directions. Square illumination approaches have been shown to offer significant improvement potential at relatively low cost. The combination of this concept with OPC and/or rounded corners for the condenser aperture further strengthens their potential for some applications.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. An imaging tool for use with a mask with features, the tool comprising a condenser lens with a condenser aperture having a non-circular shape and located in a condenser lens pupil plane.

2. The tool as set forth in claim 1 wherein the condenser aperture has a square shape.

3. The tool as set forth in claim 1 wherein the condenser aperture has a rectangular shape.

4. The tool as set forth in claim 1 further comprising a condenser plate located in the condenser lens pupil plane, the condenser lens aperture located in the condenser plate.

5. A projection imaging system comprising:
   a mask with features, wherein at least one artifact is added to at least one corner of the features;
   a condenser lens with a condenser aperture having a non-circular shape and located in a condenser lens pupil plane; and
   an illuminator positioned to illuminate at least a portion of the condenser lens pupil plane through the condenser aperture, the condenser lens positioned to place at least a portion of the illumination on to at least a portion of the features of the mask.

6. The system as set forth in claim 5 wherein the four-sides of the condenser aperture form a square shape.

7. The system as set forth in claim 5 wherein the four-sides of the condenser aperture form a rectangular shape.

8. The system as set forth in claim 5 further comprising a condenser plate located in the condenser lens pupil plane, the condenser lens aperture located in the condenser plate.

9. A method for lithography comprising:
   illuminating at least a portion of a condenser lens pupil plane of a condenser lens; and
   directing the illumination from the condenser lens on to at least a portion of a mask;
   wherein the mask has features and the condenser lens has a condenser aperture located in the condenser lens pupil plane, the condenser aperture having a non-circular shape.

10. The method as set forth in claim 9 wherein the condenser aperture has a square shape.

11. The method as set forth in claim 9 wherein the condenser aperture has a rectangular shape.

12. The method as set forth in claim 9 further comprising a condenser plate located in the condenser lens pupil plane, the condenser lens aperture located in the condenser plate.

13. A method for lithography comprising:
   illuminating at least a portion of a condenser lens pupil plane of a condenser lens; and
   directing the illumination from the condenser lens on to at least a portion of a mask;
   wherein the mask has features and at least one artifact is added to at least one corner of the features and the condenser lens has a condenser aperture located in the condenser lens pupil plane, the condenser aperture having a non-circular shape.

14. The method as set forth in claim 13 wherein the four-sides of the condenser aperture form a square shape.

15. The method as set forth in claim 13 wherein the four-sides of the condenser aperture form a rectangular shape.

16. The method as set forth in claim 13 further comprising a condenser plate located in the condenser lens pupil plane, the condenser lens aperture located in the condenser plate.

17. The tool as set forth in claim 1 wherein the condenser aperture has four-sides and four corners.

18. The tool as set forth in claim 17 wherein the features are oriented along at least an x-axis or a y-axis, the x-axis extending in directions substantially perpendicular to the directions of the y-axis and the sides of the condenser aperture are oriented in substantially the same direction as either the x-axis or the y-axis.

19. The system as set forth in claim 17 wherein at least one of the corner has a substantially rounded shape.

20. The system as set forth in claim 5 wherein the condenser aperture has four-sides.

21. The system as set forth in claim 20 wherein the features are oriented along at least an x-axis or a y-axis, the x-axis extending in directions substantially perpendicular to the directions of the y-axis and the sides of the condenser aperture are oriented in substantially the same direction as either the x-axis or the y-axis.

22. The method as set forth in claim 9 wherein the condenser aperture has four-sides and four corners.

23. The method as set forth in claim 22 wherein the features are oriented along at least an x-axis or y-axis, the x-axis extending in directions substantially perpendicular to the directions of the y-axis and the sides of the condenser aperture are oriented in substantially the same direction as either the x-axis or the y-axis.

24. The method as set forth in claim 22 wherein at least one of the corners has a substantially rounded shape.

25. The method as set forth in claim 13 wherein the condenser aperture has four-sides.

26. The method as set forth in claim 25 wherein the features are oriented along at least an x-axis or y-axis, the x-axis extending in directions substantially perpendicular to the directions of the y-axis, and the sides of the condenser aperture are oriented in substantially the same direction as either the x-axis or the y-axis.

\* \* \* \* \*